(12) United States Patent
Sorsby

(10) Patent No.: US 8,233,850 B1
(45) Date of Patent: Jul. 31, 2012

(54) BROADBAND POWER AMPLIFIER WITH PARTIAL-ENVELOPE TRANSFERENCE

(75) Inventor: William B. Sorsby, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 978 days.

(21) Appl. No.: 12/286,021

(22) Filed: Sep. 26, 2008

(51) Int. Cl.
*H04B 1/04* (2006.01)

(52) U.S. Cl. .... 455/114.3; 455/91; 455/102; 455/127.1; 455/118; 330/10; 330/136

(58) Field of Classification Search .............. 455/91, 455/102, 108, 110, 114.3, 118, 127.1; 330/10, 330/136
See application file for complete search history.

(56) References Cited

U.S. PATENT DOCUMENTS

| | | | |
|---|---|---|---|
| 4,963,945 A | 10/1990 | Cooper et al. | |
| 6,194,980 B1 | 2/2001 | Thon | |
| 6,449,465 B1 * | 9/2002 | Gailus et al. | 455/126 |
| 6,549,560 B1 | 4/2003 | Maiuzzo et al. | |
| 6,590,940 B1 * | 7/2003 | Camp et al. | 375/297 |
| 7,126,999 B2 | 10/2006 | Dent | |
| 7,391,261 B2 | 6/2008 | Dittmer | |
| 7,873,116 B2 | 1/2011 | Okada et al. | |
| 2003/0045244 A1 | 3/2003 | Lindemann et al. | |
| 2010/0197231 A1 | 8/2010 | Kenington | |

OTHER PUBLICATIONS

U.S. Appl. No. 12/493,100, filed Jun. 26, 2009, Sorsby.
U.S. Appl. No. 12/955,716, filed Nov. 29, 2010, Sorsby.

* cited by examiner

*Primary Examiner* — Tuan Pham
(74) *Attorney, Agent, or Firm* — Donna P. Suchy; Daniel M. Barbieri

(57) ABSTRACT

A method for amplifying a modulated input signal includes separating a dominant low-frequency amplitude component from the modulated input signal. The method further includes separating, from the modulated input signal, a residual signal from which the dominant low-frequency amplitude component has been removed, wherein the residual signal retains the phase information of the input signal, and wherein the residual signal maintains a portion of the amplitude modulation of the input signal. The method yet further includes providing the residual signal to an amplifier while modulating an amplifier supply voltage as a function of the dominant low-frequency amplitude component.

23 Claims, 10 Drawing Sheets

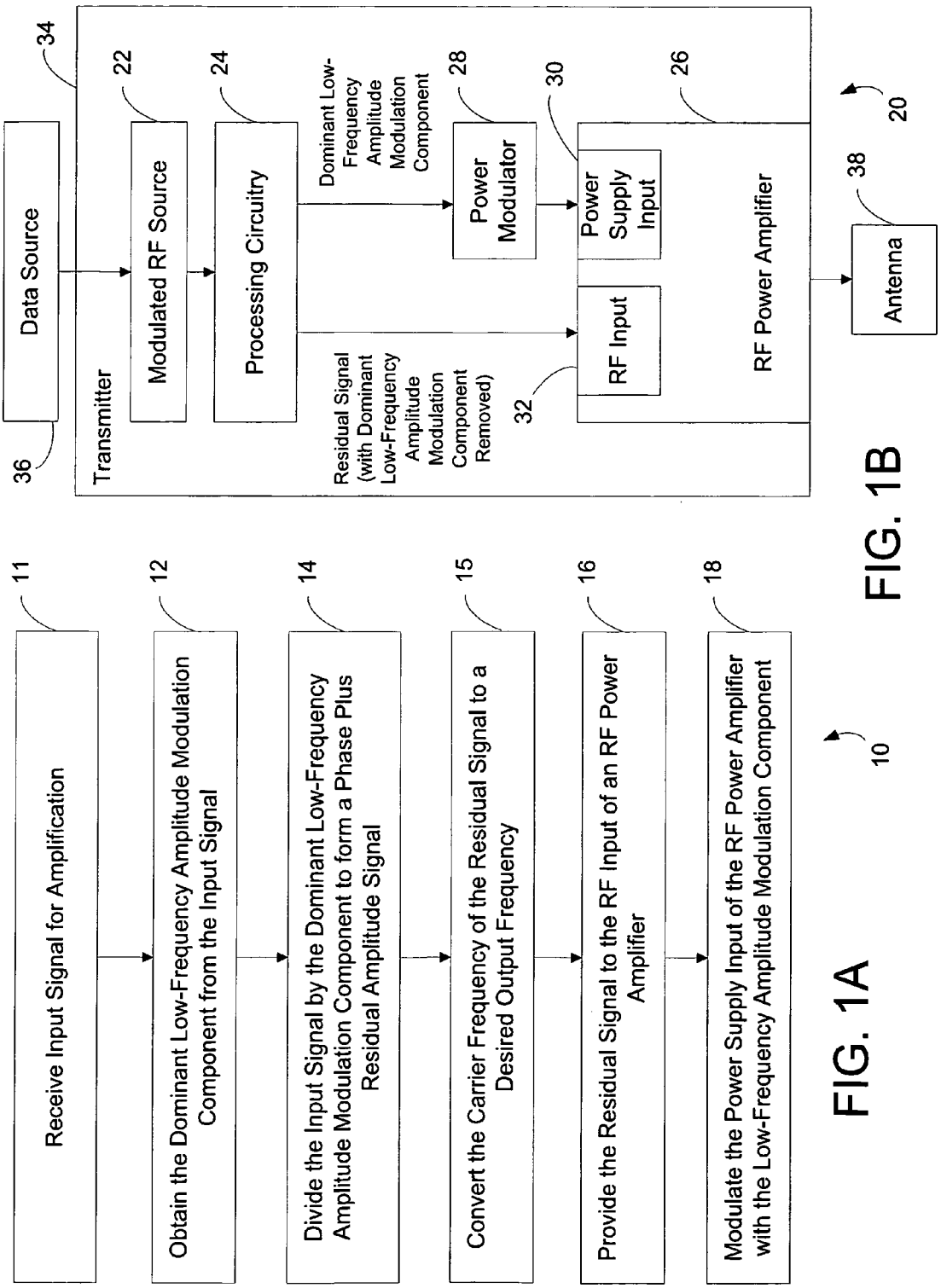

BROADBAND POWER AMPLIFIER WITH PARTIAL-ENVELOPE TRANSFERENCE

BACKGROUND

The present invention relates generally to the field of broadband power amplifiers. The present invention more particularly relates to broadband power amplifiers used with high peak-to-average power ratio waveforms.

Conventional broadband power amplifiers which must be used with high peak-to-average power ratio (PAPR) waveforms, such as orthogonal frequency division multiplexing (OFDM) and wideband code division multiple access (WCDMA) amplifiers exhibit power efficiencies well under 20%. This low level of power-efficiency forces significant system limitations in size, weight, operating time (duty cycle), and the number of simultaneous signals which can be transmitted from a platform (e.g., airplane, mobile ground vehicle, helicopter, human-portable communication device, etc.) due to serious thermal constraints.

Various limited solutions exist when operation can be restricted to a narrow range of frequencies (e.g., five percent bandwidth around operating frequency). Maintaining the necessary tolerances for successful operation of some of the solutions across an octave frequency range remains a daunting challenge. Across a wide range (e.g., 225 MHz to 400 MHz) a good option does not exist for achieving high amplifier power-efficiency with high peak-to-average power ratio waveforms.

Despite power efficiency problems with complex PAPR waveforms, the need for these waveforms remains high because they offer high spectral-efficiency; their theoretically sharp knife-edge frequency roll-off at the channel edges enables more users to operate within a given window of the RF spectrum. Theoretically, WCDMA and OFDM allow users to operate in immediately adjacent channels without experiencing interference. However, these waveforms produce no interference in adjacent channels only if near-ideal amplifiers are used for transmission.

What is needed is a power amplification system and method that improves efficiency of the amplifier, covers wide frequency bands, and is suitable for handling multiple waveforms with low levels of distortion and noise output. Other features and advantages will be made apparent from the present specification. The teachings disclosed extend to those embodiments which fall within the scope of the appended claims, regardless of whether they accomplish one or more of the aforementioned needs.

SUMMARY

One embodiment of the invention relates to a method for amplifying a modulated input signal. The method includes the steps of separating a dominant low-frequency amplitude component from the modulated input signal. The method further includes separating, from the modulated input signal, a residual signal from which the dominant low-frequency amplitude component has been removed, wherein the phase information of the residual signal has not changed. The method further includes providing the residual signal to an amplifier while modulating an amplifier supply voltage as a function of the dominant low-frequency amplitude component.

Another embodiment of the invention relates to a system for amplifying a modulated input signal. The system includes a low-pass filter configured to receive the input signal and to output a dominant low-frequency signal from the input signal. The system further includes a divider configured to divide the input signal by the dominant low-frequency signal to obtain a residual signal. The system yet further includes a power modulator configured to provide the dominant low-frequency amplitude component of the input signal to a power supply input of a power amplifier as a high-level modulating signal. The residual signal is applied to a signal input of the power amplifier while the corresponding dominant low-frequency amplitude component of the input signal is provided to the power supply input.

Another embodiment relates to a transmitter configured to provide a modulated radio frequency signal to an antenna based on input received from a data source. The transmitter includes an input interface for receiving the input from a data source. The transmitter also includes a modulator configured to modulate the input received at the input interface to generate a modulated signal. The transmitter further includes an amplifier providing an amplified signal to the antenna interface, the amplifier comprising a signal input and a power supply input. The transmitter yet further includes a processing circuit configured to separate a dominant low-frequency amplitude component from the modulated signal. The processing circuit also separates, from the modulated signal, a residual signal from which the dominant low-frequency amplitude component has been removed. The processing circuit is further configured to provide the residual signal to the signal input of the amplifier while providing the dominant low-frequency amplitude component to the power supply input of the amplifier.

Another embodiment of the invention relates to a system for amplifying a modulated input signal. The system includes means for separating a dominant low-frequency amplitude component from the modulated input signal. The system further includes means for separating, from the modulated input signal, a residual signal from which the dominant low-frequency amplitude component has been removed. The system further includes means for providing the residual signal to an amplifier while modulating an amplifier supply voltage as a function of the dominant low-frequency amplitude component.

Another embodiment relates to a modulator configured to produce a desired complex modulated signal based on input from a data source. The modulator includes an input interface receiving the input from the data source. The modulator further includes an amplitude modulation element generating a dominant low-frequency amplitude signal. The modulator yet further includes a modulation circuitry configured to generate a residual signal having phase information and having amplitude information complementary to the dominant low-frequency amplitude signal such that multiplication of the residual signal by the dominant low-frequency amplitude modulation signal produces the desired complex modulated signal. The modulation circuitry may also be configured to modulate a carrier frequency with the residual signal prior to subsequent amplitude modulation by the dominant low-frequency amplitude signal. The residual signal can be provided to a signal input of an amplifier and the dominant low-frequency amplitude signal can be provided to a power supply input of the amplifier.

Yet another embodiment relates to a method for generating a complex modulated signal for radio frequency transmission based on input from a data source. The method includes receiving the input from the data source. The method further includes generating a dominant low-frequency amplitude signal. The method yet further includes generating a residual signal having phase information and having amplitude information complementary to the dominant low-frequency amplitude signal such that multiplication of the residual signal by the dominant low-frequency amplitude modulation signal produces the desired complex modulating signal. The residual signal can be provided to a signal input of an amplifier and the dominant low-frequency amplitude signal can be provided to a power supply input of the amplifier.

Alternative exemplary embodiments relate to other features and combinations of features as may be generally recited in the claims.

BRIEF DESCRIPTION OF THE FIGURES

The invention will become more fully understood from the following detailed description, taken in conjunction with the accompanying drawings, wherein like reference numerals refer to like elements, in which:

FIG. 1A is a top level flow chart of a process 10 for amplifying a modulated input signal, according to an exemplary embodiment;

FIG. 1B is a simplified block diagram of a system 20 for amplifying a modulated input signal, according to an exemplary embodiment;

DETAILED DESCRIPTION

Figure 1C:
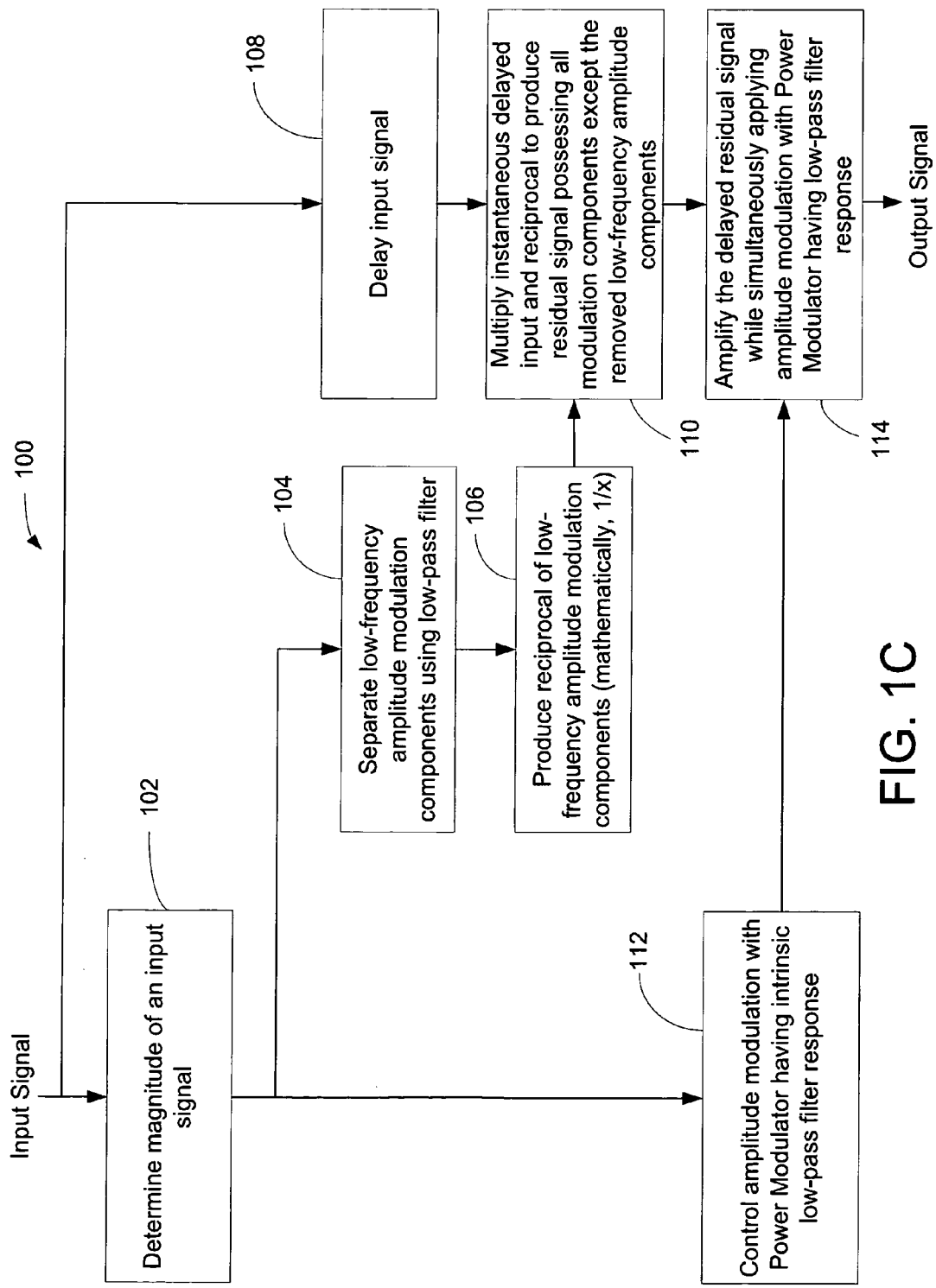
FIG. 1C is a more detailed flow chart of a process 100 for amplifying a modulated input signal, according to an exemplary embodiment.

Before turning to the figures, which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

Referring generally to the Figures, a high-efficiency amplification technique regenerates a theoretically optimal signal using a power modulator bandwidth no greater than the signal information bandwidth. After separating a complex input signal into a low-frequency amplitude component and a complementary composite phase and amplitude component, the complementary composite phase and amplitude component is characterized by nearly constant amplitude. The nearly constant amplitude allows efficient amplification and simultaneously renders the system largely immune to minor distortions. The low-frequency amplitude component modulates the final amplifier supply voltage to achieve high power efficiency.

Mathematical precision producing the complementary composite signal (without distortion correcting mechanisms such as pre-distortion) allows the technique to support theoretically optimum, or "lossless," signal reconstruction while using a power modulator bandwidth no greater than the information bandwidth, making the system unique among high-level modulation techniques for complex signals. Unlike other high-efficiency modulating techniques, no significant distortion of the signal (signal loss) occurs with the presented technique. Separating out the low-frequency amplitude component from the complex modulated input signal allows the technique of partial envelope transference to support theoretically optimum signal reconstruction.

Partial envelope transference is a high-level amplification technique for complex signals which combines practical implementation, high power-efficiency, and theoretically optimal signal reconstruction. Traditional approaches toward high-level modulation have all required power modulators to have bandwidths considerably greater than the information bandwidth. With partial envelope transference, however, power modulator bandwidth need not be greater than the information bandwidth.

Partial envelope transference splits apart a complex input signal, extracting the bulk (or a dominant portion) of the low-frequency amplitude modulation and subsequently applying the separated low-frequency amplitude modulation to the amplifier supply voltage. The complementary composite phase and amplitude component is characterized by nearly constant amplitude which allows efficient amplification and simultaneously renders the system largely immune to minor distortions. Mathematical precision inherent in the process ensures that minimal distortion is generated.

Referring now to FIG. 1A, a top level flow chart of a process 10 for amplifying a modulated input signal is shown, according to an exemplary embodiment. Process 10 is shown to include the step of receiving an input signal for amplification (step 11). Process 10 is further shown to include the step of obtaining the low-frequency amplitude modulation component from the input signal (step 12). Process 10 is yet further shown to include the step of dividing the input signal by the low-frequency amplitude modulation component (e.g., the dominant low-frequency amplitude modulation component) to obtain a residual signal (e.g., a phase plus residual amplitude signal, the high-frequency amplitude modulation component of the input signal, etc.) (step 14). According to various exemplary embodiments the carrier frequency of the residual signal is converted to a desired output frequency (step 15). The residual signal is then provided to the RF input of an RF power amplifier (step 16) and the power supply input of the RF power amplifier is modulated with the low-frequency amplitude modulation component (step 18).

Referring now to FIG. 1B, a simplified block diagram of a system 20 for amplifying a modulated input signal (e.g., using process 10) is shown, according to an exemplary embodiment. System 20 is shown to include a modulated RF source 22 configured to provide an output that serves as the input signal (e.g., a complex input signal, a complex modulated input signal, a complex wideband input signal, a signal with a high peak-to-average power ratio, etc.) for system 20 and is intended to be amplified with minimum distortion by RF power amplifier 26. The input signal is provided from the modulated RF source 22 via cabling, PCB traces, a digital medium, an analog medium, or via any other medium. According to an exemplary embodiment, modulated RF source 22 and processing circuitry 24 are a part of the same circuitry or circuit board. Processing circuitry 24 is configured to conduct one or more of the activities described herein for providing a low-frequency amplitude modulation component and a residual signal having the high-frequency amplitude modulation component. For example, processing circuitry 24 is configured to conduct the steps of obtaining the low-frequency amplitude modulation component from the input signal and of dividing the input signal by the low-frequency amplitude modulation component to obtain the residual signal. Processing circuitry 24 is shown in FIG. 1B to provide the residual signal (having a high-frequency amplitude modulation component counterpart to the low-frequency amplitude modulation component) to RF input 32 of RF power amplifier 26. Processing circuitry 24 provides the low-frequency amplitude modulation component to power modulator 28 which modulates power supply input 30 of power amplifier 26. RF power amplifier 26 amplifies the signal at the RF input while power modulator 28 is modulating power input supply 30, resulting in an amplified signal that is lossless (or near lossless).

Referring further to FIG. 1B, elements 22-32 are shown as part of a transmitter 34, according to an exemplary embodiment. Transmitter 34 receives data for modulation, amplification, and transmission from data source 36 and provides modulated and amplified signals to antenna 38 for RF transmission. It should be noted transmitter 34 could be implemented as a part of a transceiver.

An alternative embodiment relates to a modulator configured to produce a desired complex modulated signal from a radio frequency transmitter based on input from a data source. In this alternative embodiment, the dominant low-frequency amplitude modulation component and the residual signal do not originate from a single modulated data stream. The modulator includes an input interface receiving the input from the data source. The modulator further includes an amplitude modulation element generating a dominant low-frequency amplitude signal. The modulator yet further includes a modulation circuitry configured to generate a residual signal having phase information and having amplitude information complementary to the dominant low-frequency amplitude signal such that multiplication of the residual signal by the dominant low-frequency amplitude modulation signal produces the desired complex modulated signal. The modulation circuitry may also be configured to modulate a carrier frequency with the residual signal prior to subsequent amplitude modulation by the dominant low-frequency amplitude signal.

Referring now to FIG. 1C, a more detailed flow chart of a process 100 for amplifying a modulated input signal is shown, according to an exemplary embodiment. Process 100 is shown to include the step of determining the magnitude of an input signal (step 102). Step 102, according to an exemplary embodiment, results in a signal whereby the trough of the signal is shifted to a slightly higher magnitude. According to an exemplary embodiment, the entirety of the output signal from step 102, including the trough, varies from zero to some positive number. A low-pass filter is then used to separate (step 104) the dominant low-frequency amplitude modulation component from the output of step 102. Processing then provides the reciprocal of the dominant low-frequency amplitude modulation component (step 106) (e.g., 1/x, mathematically). The original input signal is delayed in step 108 to account for any delay associated with steps 102-106. The original input signal is then multiplied by the reciprocal provided in step 106 to produce a residual signal that possesses all modulation components except the dominant low-frequency amplitude modulation components. In other words, the output of process step 110 is a phase plus residual amplitude signal from which the dominant low-frequency component has been removed. In step 112, the low-frequency amplitude modulation component is provided to a power modulator (which may have intrinsic low-pass filter response—in which case, a signal that has not been filtered may be provided to power modulator). The low-frequency amplitude modulation component (i.e., the residual signal) is then provided to the power supply input via the power modulator while simultaneously applying the delayed residual signal (e.g., having primarily high-frequency amplitude modulation components).

Figure 2A:
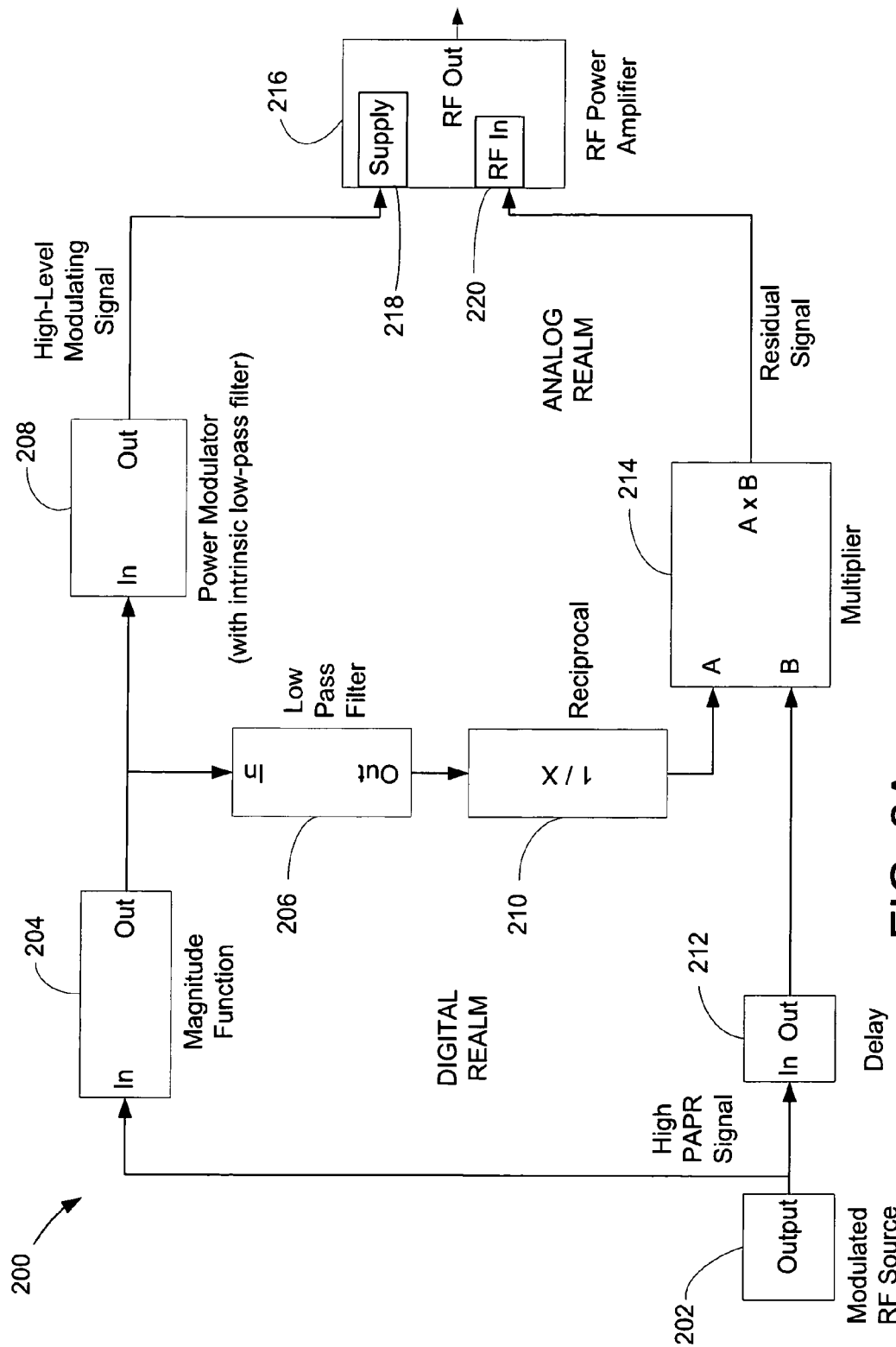
FIG. 2A is a block diagram of a system 200 for amplifying a modulated input signal, according to an exemplary embodiment.

Referring now to FIG. 2A, a block diagram of a system 200 for amplifying a modulated input signal is shown, according to an exemplary embodiment. System 200 is shown to include a modulated RF source 202. According to an exemplary embodiment, the input signal is a high peak to average power ratio (PAPR) signal. The input signal is provided to a magnitude function 204. The magnitude function 204 provides the result of its activity to low-pass filter 206 and power modulator 208. Reciprocal element 210 produces the reciprocal (mathematically, 1/x) of the dominant low-frequency amplitude modulation component separated by low pass filter 206. The reciprocal is provided to multiplier 214 which multiplies the output from delay element 212 to produce a residual signal having all modulation components (e.g., phase, high-frequency amplitude components, etc.) of the input signal except the dominant low-frequency amplitude components. Output from magnitude function 204, as previously mentioned, is also provided to power modulator 208 having an intrinsic low-pass filter. Power modulator 208 outputs a high-level modulating signal which is provided to supply voltage input 218 of RF power amplifier 216. RF power amplifier 216 receives the residual signal from multiplier 214 at RF input 220. RF power amplifier 216 then amplifies the residual signal provided to RF input 220 while power modulator 208 is providing the low-frequency amplitude modulation component to supply 218, modulating the amplifier's supply voltage as a function of the low-frequency amplitude modulation component.

Figure 2B:
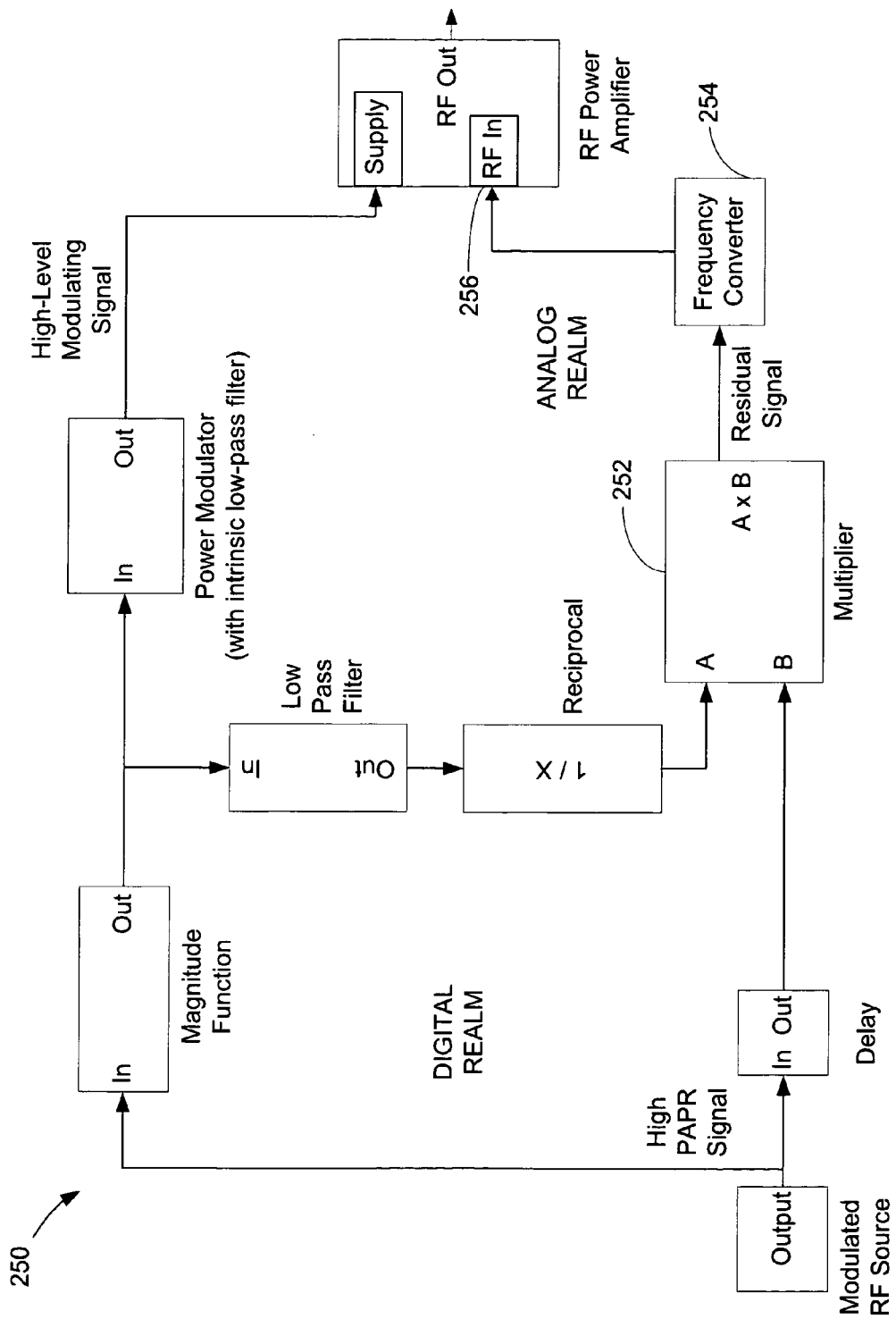
FIG. 2B is a block diagram of a system 250 for amplifying a modulated input signal, according to an alternative exemplary embodiment.

Referring now to FIG. 2B, a block diagram of a system 250 for amplifying a modulated input signal is shown, according to an alternative exemplary embodiment. In the embodiment shown in FIG. 2B, frequency converter 254 is shown to receive the residual signal from multiplier 252. Frequency converter 254 can upconvert the carrier frequency of the residual signal to a new carrier frequency (e.g., a desired carrier frequency) and provide the upconverted residual signal to RF input 256. It should be noted that throughout this specification and the claims various aspects of the signal could be adjusted (filtered, upconverted, downconverted, upsampled, shifted, etc.) without departing from the scope of the appended claims.

Figure 3:
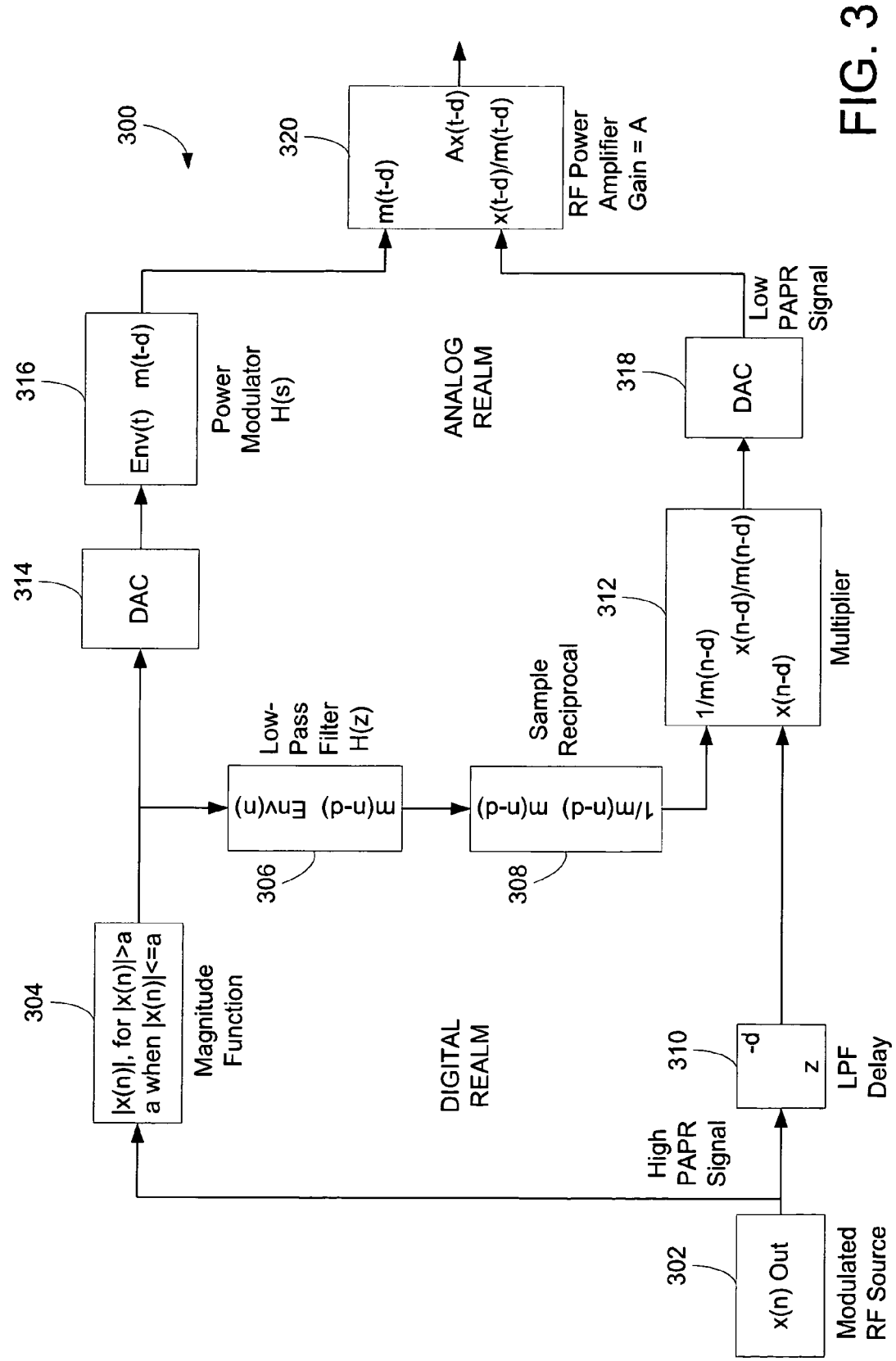
FIG. 3 is a block diagram of a system 300 for amplifying a modulated input signal, according to an exemplary embodiment.

Referring now to FIG. 3, a more detailed block diagram of a system 300 for amplifying a modulated input signal is shown, according to an exemplary embodiment. Modulated RF source 302 is shown as outputting a modulated high-PAPR input signal x(n). Magnitude function 304 is shown to output the magnitude of the signal when the magnitude is greater than a threshold "a" and to output the threshold a when the magnitude is less than or equal to "a". Magnitude function 304 effectively shifts samples provided to it so that even the troughs of the signals are above some threshold (e.g., above threshold "a", above zero, etc.). Output from the magnitude function, envelope signal Env(n), is provided to DAC 314 and low-pass filter 306. DAC 314 converts Env(n) into its continuous time counterpart Env(t), which is subsequently low-pass filtered in accordance with the transfer function characteristics of power modulator 316 having transfer function H(s) to obtain the final modulating signal m(t−d), where d represents the delay introduced by H(s).

The signal Env(n) travels an alternate path in the discrete-time domain (i.e., digital domain) to undergo filtering trough low-pass filter 306 (e.g., a discrete-time low-pass filter) having transfer function H(z), which is the discrete-time counterpart to the continuous-time transfer function H(s). The output from low-pass filter 306 can be represented by m(n−d) and is the discrete-time counterpart (or as close as possible, given normal hardware inaccuracies) to the continuous time modulating signal m(t−d). Sample reciprocal element 308 provides the reciprocal of the output from low-pass filter 306 (i.e., m(n−d)) to multiplier 312. Multiplier 312 is also provided delayed samples of x(n), the delay provided by delay element 310, the magnitude of the delay corresponding to the delay of low-pass filter 306. The intermediate signal provided at the output of the multiplier (i.e., the sample-by-sample divider comprised of reciprocal block 308 and multiplier 312) is: (x(n−d))/(m/(n−d)). DAC 318 receives the intermediate signal and outputs a continuous time signal that can be characterized as having a residual signal (e.g., having primarily phase and high-frequency amplitude modulation components from which the dominant low-frequency amplitude modulation component has been removed) and being a low-PAPR signal. Accordingly, the low-frequency amplitude modulation component is provided to the power supply input of RF power amplifier 320 via power modulator 316. When amplified and modulated at RF power amplifier 320, the output becomes:

$$A * \frac{x(n-d)}{m(n-d)} = Ax(t-d),$$

which is the desired result—amplification of the input signal x(n).

Referring still to FIG. 3, when power modulator 316 (and/or its transfer function H(s)) is restricted so that its bandwidth approximates the information bandwidth, then the low-frequency amplitude modulation component m(n−d) provided to power modulator 320 approximates the envelope of x(n−d) even during amplitude troughs. Therefore, RF power amplifier 320 can be designed to operate very efficiently when driving a low-PAPR signal. Simulations for the technique of partial envelope transference indicate that strict linearity in the power amplifier stage, using this method/design is not necessary. Simulation data shows that good results can be obtained with power amplifier 320 operated well into saturation without adversely affecting output signal fidelity. For example, operation with between 3 dB and 6 dB of compression have yielded good results during simulations.

Figure 4:
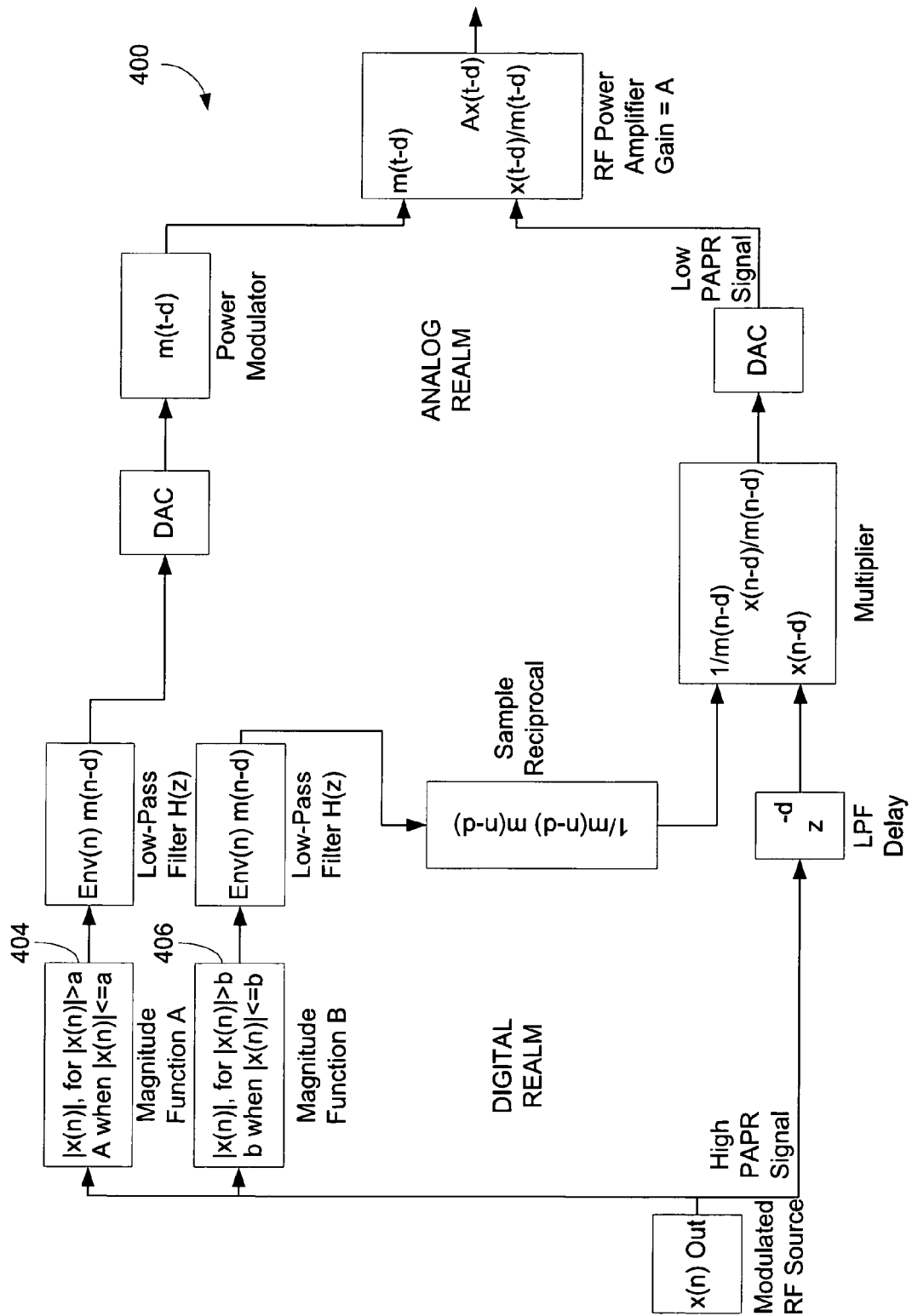
FIG. 4 is a block diagram of a system 400 for amplifying a modulated input signal, according to an exemplary embodiment.

Referring now to FIG. 4, a block diagram of a system 400 for amplifying a modulated input signal is shown, according to an alternative exemplary embodiment. It has been observed that dual thresholds can be used to efficiently offset a level shift resulting from compression within the power amplifier. When the system is operated with dual thresholds (as is shown in system 400, illustrated by different magnitude functions A and B), distortion to the envelope can be minimized, resulting in negligible channel interference. Overall transmitter power-efficiency (including power modulator efficiency and power amplifier efficiency) is expected to be in the fifty to seventy five percent range. According to the exemplary embodiment shown in FIG. 4, magnitude function 404 is configured to ensure a minimum signal threshold "a" while magnitude function 406 is configured to ensure a minimum signal threshold "b."

Figure 5:
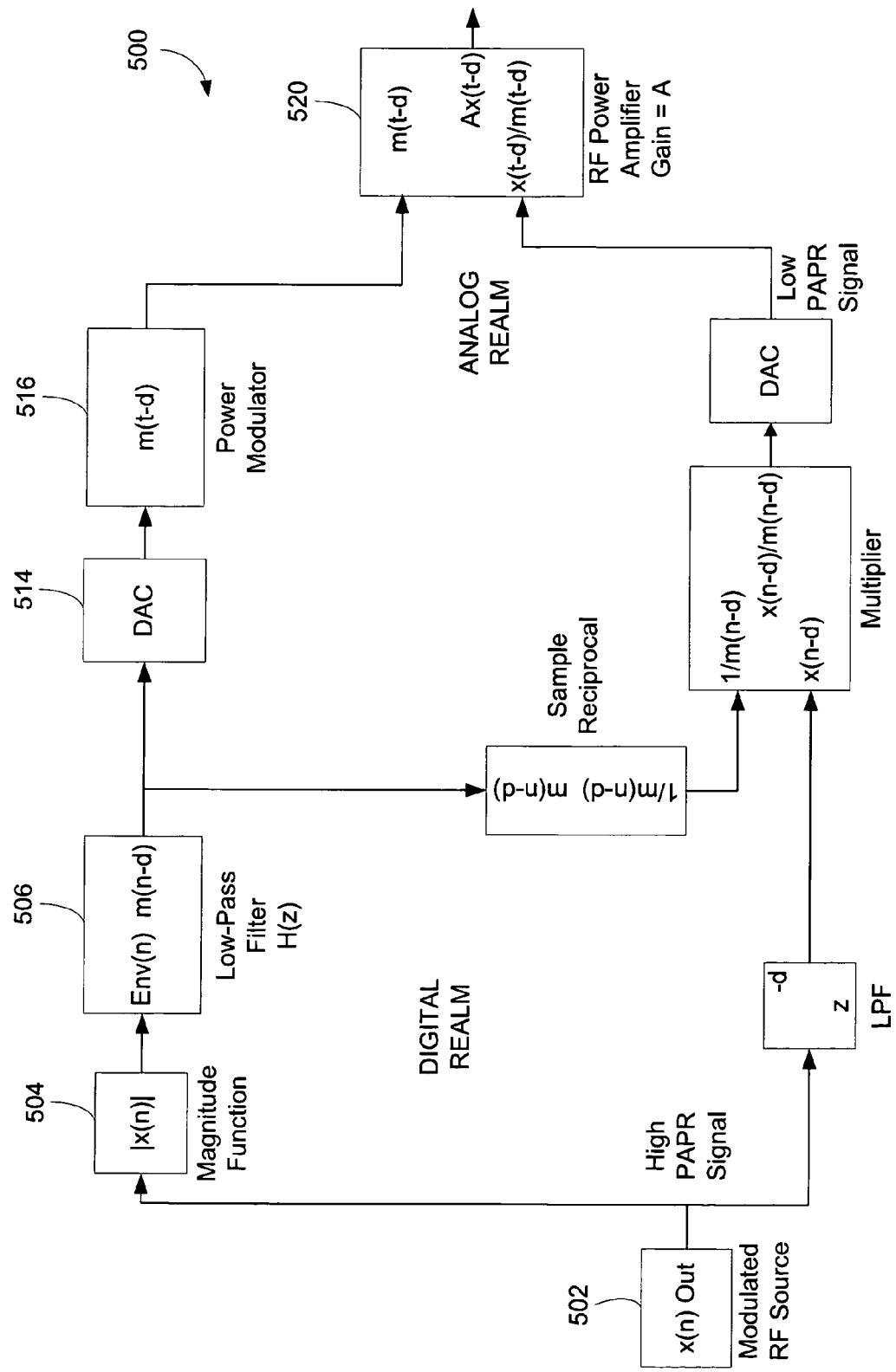
FIG. 5 is a block diagram of a system 500 for amplifying a modulated input signal, according to an exemplary embodiment.

Referring now to FIG. 5, a block diagram of a system 500 for amplifying a modulated input signal is shown, according to an alternative exemplary embodiment. System 500 and FIG. 5 illustrate an implementation where the signal envelope is determined directly from a digitally modulated input stream. This system could be implemented when the exciter (i.e., modulated RF source 502) and the power amplifier are physically separated but the exciter can easily provide the fully modulated signal in digital form. According to the exemplary embodiment shown, the output of the low-pass filter is provided to DAC 514 (and thereby power modulator 516). This configuration assumes that the frequency response of power modulator 516 is sufficiently larger than the low-pass filter response H(z) and that power modulator 516 response has negligible effect on the final waveform and can be ignored.

Figure 6:
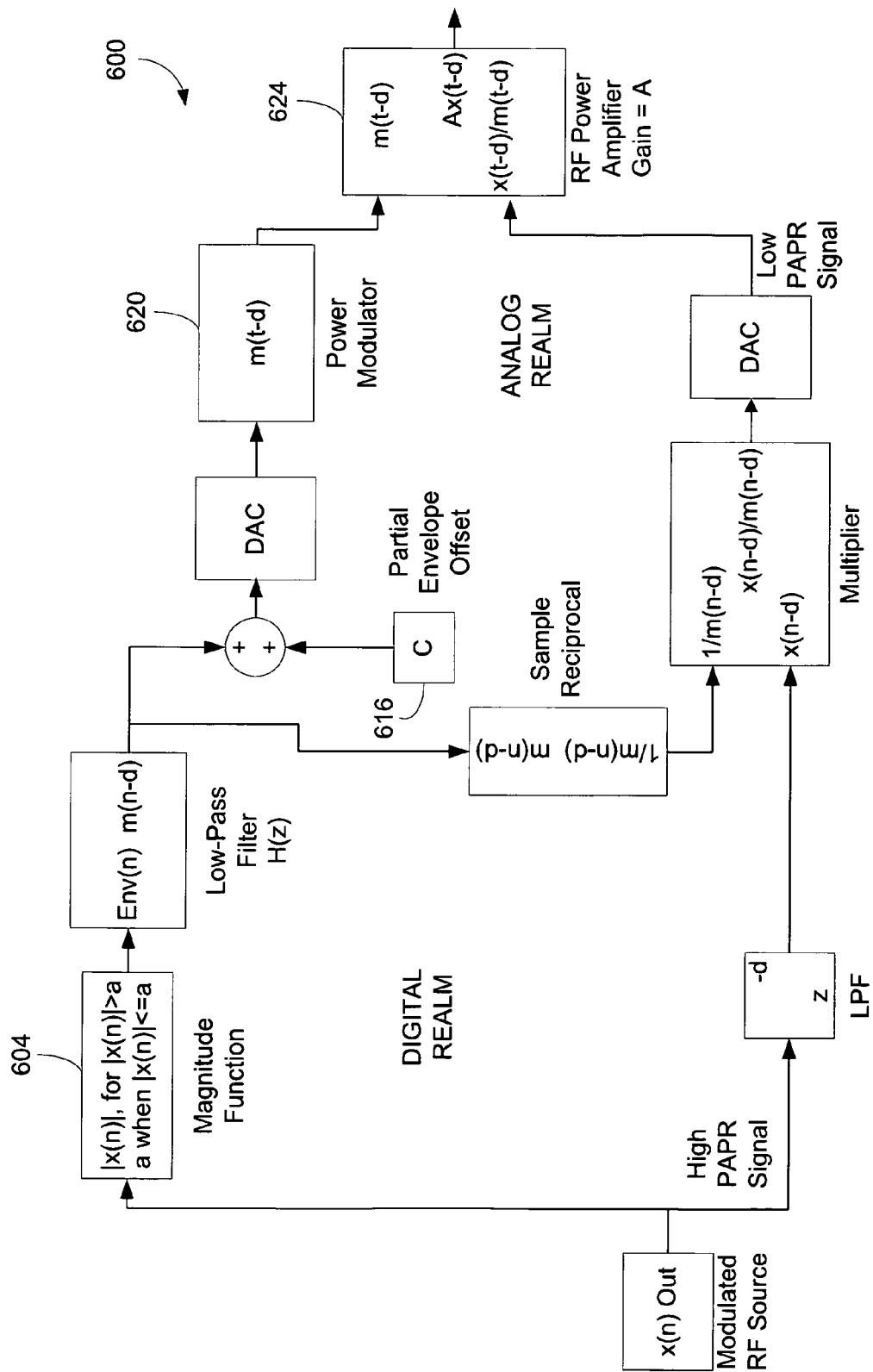
FIG. 6 is a block diagram of a system 600 for amplifying a modulated input signal, according to an exemplary embodiment.

Referring now to FIG. 6, a block diagram of a system 600 for amplifying a modulated input signal is shown, according to an alternative exemplary embodiment. System 600 advantageously includes enhancements which control negative modulation excursions. The distortion-generating high-frequency components of many high-PAPR waveforms reside predominantly within the troughs, or negative peak excursions, of the modulation. Controlling some aspects of these negative modulation excursions allows considerable spectral containment to be accomplished without resorting to elaborate measures. Magnitude function 604 (i.e., magnitude detector) includes a threshold adjustment which shifts the percentage of negative modulation which is begin transferred to the high-level modulator and a negative peak offset control 616 adjusts for expansion that compression imparts to the trough. The introduction of an offset on the re-modulated negative peak amplitude moves the waveform low-frequency amplitude valleys closer to zero, thereby diminishing the wideband spectrum components which would otherwise appear at the output of power amplifier 624. The threshold control activity at the magnitude function (i.e., envelope detector) varies the amplitude of the negative excursions re-modulated via the power-modulator 620. For example, if the threshold were to be set too high, then no modulation would be transferred to power modulator 620. A more optimum threshold value for minimizing broadband spectral components occurs when the threshold is set near the inflection points of the waveform amplitude modulation.

Figure 7:
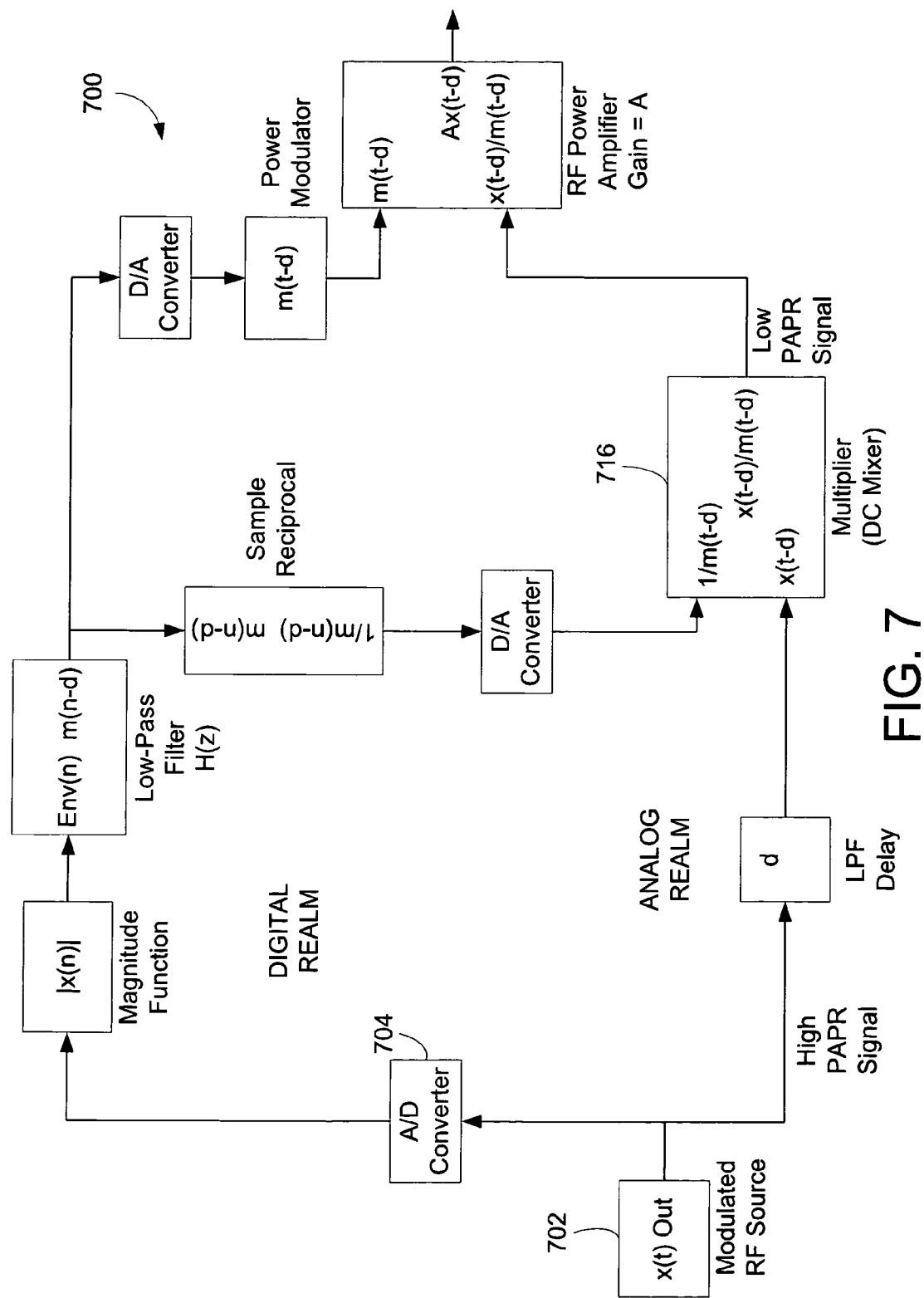
FIG. 7 is a block diagram of a system 700 for amplifying a modulated input signal, according to an exemplary embodiment.

Referring now to FIG. 7, a block diagram of a system 700 for amplifying a modulated input signal is shown, according to an alternative exemplary embodiment. In system 700, modulated RF source 702 is an analog source that provides a modulated analog signal (i.e., the RF signal is provided from modulated RF source 702 in traditional analog fashion). Relative to the previously described embodiments, A/D converter 704 is provided between modulated RF source 702 and magnitude function 706, and multiplier 716 is a DC mixer.

Figure 8:
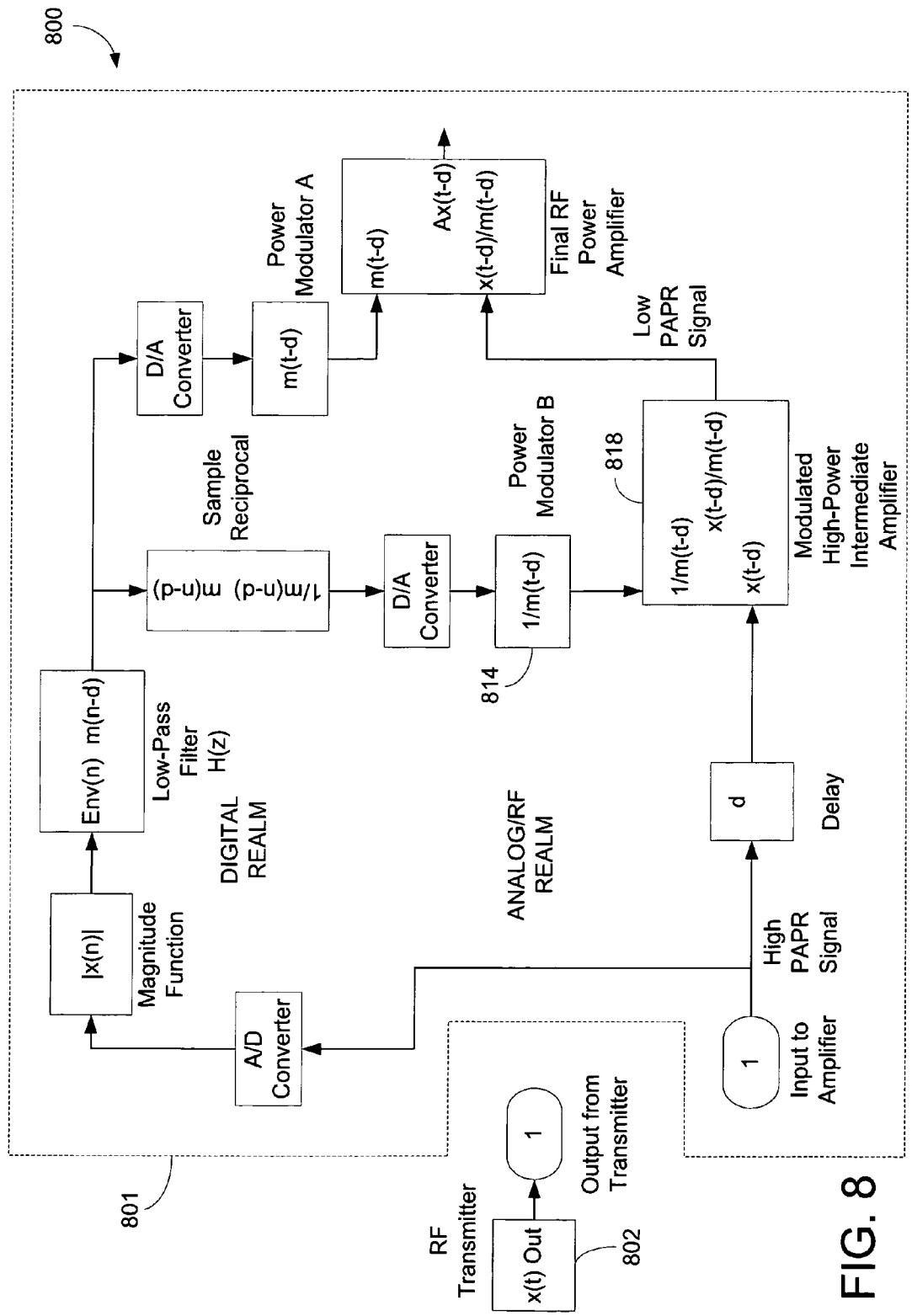
FIG. 8 is a block diagram of a system 800 for amplifying a modulated input signal, according to an exemplary embodiment.

Referring now to FIG. 8, a block diagram of a system 800 for amplifying a modulated input signal is shown, according to an alternative exemplary embodiment. In system 800, the amplifier 801 is shown physically separated from the exciter (i.e., RF transmitter 802). The RF signal is provided in traditional analog fashion. The technique of partial envelope transference supports such usage while still maintaining inherent power efficiency advantages. As shown, the component providing the reciprocal is power modulator 814 (the power modulator has a transfer function of 1/m(t–d), which provides the reciprocal to modulated high-power intermediate amplifier 818. A minimum amount of signal processing is required to provide the partial envelope transference activity. Further, all staged in such a high-power amplifier module could be operated in a power efficient manner, including efficient use of input signal power. For example, an input signal provided at an intermediate power level could be efficiently amplified by the high-power intermediate amplifier, which itself can be high-level modulated to achieve high power efficiency. With the technique of partial envelope transference, no need for frequency conversion exists, no high-stability oscillators are required, no reversion to baseband for signal regeneration is required, and no need exists to reduce input signal power to accomplish small-signal operations on the input signal. Further, amplification can be achieved on-frequency, as with conventional power amplifiers.

The above embodiments, and other embodiments that may be covered by the Claims, advantageously offer high power-efficiency in broadband power amplifiers operating at multiple frequencies spread across the frequency spectrum and in power amplifiers which must handle wideband waveforms. The final power amplifier stage may be operated well into saturation with the resulting inherent high power-efficiency, but the driver stage and all preceding stages can also be operated at or near compression, allowing relatively high power-efficiency throughout the entire RF chain.

While the detailed drawings, specific examples, detailed algorithms, and particular configurations given describe preferred and exemplary embodiments, they serve the purpose of illustration only. The inventions disclosed are not limited to the specific steps and configurations shown. For example, the methods may be performed in any of a variety of sequence of steps or according to any of a variety of mathematical formulas. The hardware and/or software configurations shown and described may differ depending on the chosen performance characteristics and physical characteristics of the systems and devices used therewith. For example, the type of hardware components and their interconnections may differ. The systems and methods depicted and described are not limited to the precise details and conditions disclosed. The flow charts show preferred exemplary operations only; some of the steps may be optional (e.g., converting step 15 shown in FIG. 1A) or varied. The specific data types and operations are shown in a non-limiting fashion. Furthermore, other substitutions, modifications, changes, and omissions may be made in the design, operating conditions, and arrangement of the exemplary embodiments without departing from the scope of the invention as expressed in the appended claims.

What is claimed is:

1. A method of amplifying a modulated input signal, the method comprising:
   separating a dominant low-frequency amplitude component from the modulated input signal;
   separating, from the modulated input signal, a residual signal from which the dominant low-frequency amplitude component has been removed, wherein the residual signal retains the phase information of the input signal, and wherein the residual signal maintains a portion of the amplitude modulation of the input signal; and
   providing the residual signal to an amplifier while modulating an amplifier supply voltage as a function of the dominant low-frequency amplitude component, wherein separating, from the modulated input signal, the residual signal from which the dominant low-frequency amplitude component has been removed comprises:
   multiplying the reciprocal of the dominant low-frequency amplitude component by the modulated input signal to produce the residual signal.

2. The method of claim 1, wherein separating uses a divider.

3. The method of claim 2, wherein the modulation of the amplifier supply voltage comprises:
   providing the dominant low-frequency amplitude component to a power modulator to produce a high-level modulating signal; and
   providing the high-level modulating signal to the amplifier supply voltage input.

4. The method of claim 3, further comprising:
   amplifying the high-level modulating signal using the power modulator.

5. The method of claim 4, wherein the input signal is a digital signal and wherein the separation of the dominant low-frequency amplitude component and the residual signal occurs in the digital domain.

6. The method of claim 5, wherein the power modulator provides the high-level modulating signal as a continuous time signal.

7. The method of claim 6, wherein filtering the low-frequency amplitude component from the input signal comprises:
   providing the input signal to a magnitude function; and
   providing the output from the magnitude function to a low-pass filter.

8. The method of claim 7, wherein the magnitude function includes a threshold adjustment which shifts a percentage of modulation transferred to the power modulator.

9. The method of claim 1, further comprising:
   converting the carrier frequency of the residual signal to a different output carrier frequency prior to applying the residual signal to the amplifier.

10. The method of claim 1, wherein the phase component of the residual signal is uncorrupted during the steps of the method.

11. A system for amplifying a modulated input signal, comprising:
    a low-pass filter configured to receive the input signal and to output a dominant low-frequency signal of the input signal;
    a divider configured to divide the input signal by the dominant low-frequency signal to obtain a residual signal; and
    a power modulator configured to provide the dominant low-frequency amplitude component of the input signal to a power supply input of a power amplifier as a high-level modulating signal;
    wherein the residual signal is applied to a signal input of the power amplifier while the corresponding dominant low-frequency amplitude component of the input signal is provided to the power supply input.

12. The system of claim 11, wherein the application of the residual signal to the signal input across a broadband range of carrier frequencies and the application of the dominant low-frequency amplitude component to the power supply input causes the power amplifier to output an output signal which covers a broadband range of carrier frequencies.

13. The system of claim 12, wherein the broadband range of carrier frequencies is between about 225 MHz to 400 MHz.

14. The system of claim 12, wherein the broadband range of carrier frequencies approximates an octave or greater range of frequencies.

15. The system of claim 11, wherein pre-distortion is not added to either of the residual signal or the dominant low-frequency amplitude component.

16. The system of claim 11, wherein pre-distortion is added to at least one of the residual signal and the dominant low-frequency amplitude component.

17. The system of claim 11, wherein the divider comprises a reciprocal element configured to provide the reciprocal of the dominant low-frequency signal to a multiplier that multiplies the reciprocal by the modulated input signal to produce the residual signal.

18. The system of claim 11, wherein the power modulator bandwidth is approximately equal to the information bandwidth of the input signal.

19. A transmitter configured to provide a modulated radio frequency signal to an antenna based on input received from a data source, the transmitter comprising:

an input interface for receiving the input from a data source;

a modulator configured to modulate the input received at the input interface to generate a modulated signal;

an amplifier providing an amplified signal to the antenna interface, the amplifier comprising a signal input and a power supply input; and a processing circuit configured to separate a dominant low-frequency amplitude component from the modulated signal, the processing circuit also separating, from the modulated signal, a residual signal from which the dominant low-frequency amplitude component has been removed, and wherein the processing circuit is further configured to provide the residual signal to the signal input of the amplifier while providing the dominant low-frequency amplitude component to the power supply input of the amplifier, wherein separating, from the modulated input signal, the residual signal from which the dominant low-frequency amplitude component has been removed comprises:

multiplying the reciprocal of the dominant low-frequency amplitude component by the modulated input signal to produce the residual signal.

20. A system for amplifying a modulated input signal, comprising:

means for separating a dominant low-frequency amplitude component from the modulated input signal;

means for separating, from the modulated input signal, a residual signal from which the dominant low-frequency amplitude component has been removed, wherein the residual signal retains the phase information of the input signal, and wherein the residual signal maintains a portion of the amplitude modulation of the input signal, wherein separating, from the modulated input signal, the residual signal from which the dominant low-frequency amplitude component has been removed comprises multiplying the reciprocal of the dominant low-frequency amplitude component by the modulated input signal to produce the residual signal; and means for providing the residual signal to an amplifier while modulating an amplifier supply voltage as a function of the dominant low-frequency amplitude component.

21. A broadband amplifier, comprising:

a processing circuit configured to provide;

a low-pass filter configured to receive an input signal and to output a dominant low-frequency signal of the input signal;

a divider configured to divide the input signal by the dominant low-frequency signal to obtain a residual signal;

a power modulator configured to provide the dominant low-frequency amplitude component of the input signal to a power supply input of a power amplifier as a high-level modulating signal; and wherein the residual signal is applied to a signal input of the power amplifier while the corresponding dominant low-frequency amplitude component of the input signal is provided to the power supply input.

22. The amplifier of claim 21, wherein the input signal is a digital signal and wherein the separation of the dominant low-frequency amplitude component and the residual signal occurs in the digital domain.

23. A power amplifier, comprising:

a processing circuit configured to provide;

a low-pass filter configured to receive an input signal and to output a dominant low-frequency signal of the input signal;

a divider configured to divide the input signal by the dominant low-frequency signal to obtain a residual signal;

a power modulator configured to provide the dominant low-frequency amplitude component of the input signal to a power supply input of a power amplifier as a high-level modulating signal; and wherein the residual signal is applied to a signal input of the power amplifier while the corresponding dominant low-frequency amplitude component of the input signal is provided to the power supply input, wherein the application of the residual signal to the signal input across a broadband range of carrier frequencies and the application of the dominant low-frequency amplitude component to the power supply input causes the power amplifier to output an output signal which covers a broadband range of carrier frequencies.

* * * * *